(12) United States Patent
Patil et al.

(10) Patent No.: US 7,911,234 B1
(45) Date of Patent: Mar. 22, 2011

(54) NANOTUBE LOGIC CIRCUITS

(75) Inventors: Nishant Patil, Mountain View, CA (US); Subhasish Mitra, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/240,365

(22) Filed: Sep. 29, 2008

Related U.S. Application Data

(60) Provisional application No. 60/976,135, filed on Sep. 28, 2007.

(51) Int. Cl.
*H03K 19/20* (2006.01)

(52) U.S. Cl. .......................... 326/104; 257/211

(58) Field of Classification Search ................ 326/130, 326/38, 104; 257/324, 211, 213, 202, 296, 257/419; 455/335; 977/734–754, 932
See application file for complete search history.

(56) References Cited

U.S. PATENT DOCUMENTS

| | | | |
|---|---|---|---|
| 4,763,289 | A | 8/1988 | Barzilai et al. |
| 6,691,286 | B1 | 2/2004 | McElvain et al. |
| 6,707,098 | B2 * | 3/2004 | Hofmann et al. ............ 257/324 |
| 6,781,166 | B2 * | 8/2004 | Lieber et al. ................ 257/211 |
| 6,798,000 | B2 | 9/2004 | Luyken et al. |
| 6,820,244 | B2 | 11/2004 | Lincoln |
| 6,972,467 | B2 * | 12/2005 | Zhang et al. ................ 257/401 |
| 6,990,009 | B2 * | 1/2006 | Bertin et al. ............... 365/151 |
| 7,265,575 | B2 * | 9/2007 | Bertin ............................ 326/30 |
| 7,541,842 | B2 * | 6/2009 | Bertin et al. ................ 326/104 |
| 7,564,269 | B2 * | 7/2009 | Bertin ........................... 326/120 |
| 7,582,534 | B2 * | 9/2009 | Afzali-Ardakani et al. .. 438/287 |
| 2003/0058697 | A1 | 3/2003 | Tour et al. |
| 2004/0238887 | A1 * | 12/2004 | Nihey ........................... 257/347 |
| 2005/0035786 | A1 * | 2/2005 | Bertin et al. ................ 326/104 |
| 2007/0141762 | A1 | 6/2007 | Hyde et al. |
| 2007/0205450 | A1 * | 9/2007 | Okita ........................... 257/296 |

OTHER PUBLICATIONS

Atienza, David et al., "System-Level Design for Nano-Electronics," 14th IEEE International Conference in Electronics, Circuits and Systems (ICECS), 2007, pp. 747-751, Morocco, IEEE.
Banerjee, Kaustav et al., "Are Carbon Nanotubes the Future of VLSI Interconnections?," Design Automation Conference, 2006, pp. 809-814, San Francisco, CA, ACM.
Beer, Ilan et al., "RuleBase: An Industry-Oriented Formal Verification Tool," Proc. Design Automation Conference, 1996.
Butts, Michael et al., "Molecular Electronics: Devices, Systems and Tools for Gigagate, Gigabit Chips," International Conference on Computer-Aided Design, Nov. 2002, pp. 1-8.
Chen, Jia et al., "Air-Stable Chemical Doping of Carbon Nanotube Transistors," Device Research Conference, Jun. 21-23, 2004, 62nd DRC, Conference Digest, pp. 137-138.

(Continued)

*Primary Examiner* — Rexford N Barnie
*Assistant Examiner* — Crystal L Hammond
(74) *Attorney, Agent, or Firm* — Withrow & Terranova, P.L.L.C.

(57) ABSTRACT

A logic cell that is immune to misaligned carbon nanotubes. Carbon nanotubes are positioned on a substrate. Contacts are formed on a layer of carbon nanotubes, including a first input contact, a second input contact, an output contact, a first gate region, and a second gate region. The output contact is positioned between the first input contact and the second input contact, and a cell region is provided bounded by a width of the output contact and residing between the first input contact and the second input contact. A nonconductive region is positioned in the layer of carbon nanotubes between any two or more of the plurality of contacts that, if shorted, would inhibit a logic function.

24 Claims, 12 Drawing Sheets

OTHER PUBLICATIONS

Collins, Philip G. et al., "Engineering Carbon Nanotubes and Nanotube Circuits Using Electrical Breakdown," Science, Apr. 27, 2001, pp. 706-708, vol. 292.

Dehon, Andre et al., "Seven Strategies for Tolerating Highly Defective Fabrication," IEEE Design & Test of Computers, 2005, pp. 306-315, vol. 22, No. 4, IEEE.

Deng, Jie et al., "Carbon Nanotube Transistor Circuits: Circuit-Level Performance Benchmarking and Design Options for Living with Imperfections," 2007 IEEE International solid-State Circuits Conference, 2007, pp. 70-71 and 588, IEEE.

Deng, Jie et al., "A Circuit-Compatible SPICE Model for Enhancement Mode Carbon Nanotube Field Effect Transistors," Proceedings of the International Conference on Simulation of Semiconductor Processes and Devices, 2006, pp. 166-169, IEEE.

Dwyer, C. et al., "Design Tools for a DNA-Guided Self-Assembling Carbon Nanotube Technology," Nanotechnology, 2004, pp. 1240-1245, vol. 15, No. 9, United Kingdom, IOP Publishing Ltd.

Fuhrer, M. S. et al., "Crossed Nanotube Junctions," Science, Apr. 21, 2000, pp. 494-497, vol. 288.

Goldstein, Seth Copen et al., "NanoFabrics: Spatial Computing Using Molecular Electronics," Proceedings of the 28th Annual International Symposium on computer Architecture, Jun. 2001, pp. 178-191.

Han, Song et al., "Template-Free Directional Growth of Single-Walled Carbon Nanotubes on a- and r-Plane Sapphire," Journal of the American Chemical Society, Mar. 22, 2005, pp. 5294-5295, vol. 127, No. 15, Washington DC, American Chemical Society.

He, Chen et al., "Defect-Aware High-Level Synthesis Targeted at Reconfigurable Nanofabrics," IEEE Transactions on Computer-Aided Design of Integrated Circuits and Systems, May 20007, pp. 817-833, vol. 26, No. 5, IEEE.

Javey, Ali et al., "Ballistic Carbon Nanotube Field-Effect Transistors," Nature, Aug. 7, 2003, pp. 654-657, vol. 424, Nature Publishing Group.

Javey, Ali et al., "High Performance n-Type Carbon Nanotube Field-Effect Transistors with Chemically Doped Contacts," Nano Letters, 2005, pp. 345-348, vol. 5, No. 2, American Chemical Society.

Kang, Seong Jun et al., "High-performance Electronics Using Dense, Perfectly Aligned Arrays of Single-walled Carbon Nanotubes," Nature Nanotechnology, Apr. 2007, pp. 230-236, vol. 2, Nature Publishing Group.

Kocabas, C. et al., Nano Letters, Mar. 30, 2007, pp. 1195-1202, vol. 7, No. 5, Washington DC, American Chemical Society.

Kocabas, Coskun et al., "Spatially Selective Guided Growth of High-Coverage Arrays and Random Networks of Single-Walled Carbon Nanotubes and Their Integration into Electronic Devices," Journal of the American Chemical Society, Mar. 22, 2006, pp. 4540-4541, vol. 128, No. 14, Washington DC, American Chemical Society.

Li, Xiaolin et al., "Chemically Derived, Ultrasmooth Graphene Nanoribbon Semiconductors," Science, Feb. 29, 2008, p. 1229-1232, vol. 319.

Li, Yiming et al., "Preferential Growth of Semiconducting Single-Walled Carbon Nanotubes by a Plasma Enhanced CVD Method," Nano Letters, Jan. 22, 2004, pp. 317-321, vol. 4, No. 2, Washington DC, American Chemical Society.

Nepal, K. et al., "Optimizing Noise-Immune Nanoscale Circuits using Principles of Markov Random Fields," Proc. Great Lakes Symposium on VLSI, 2006, pp. 149-152.

Patil, Nishant et al., "Integrated Wafer-Scale Growth and Transfer of Directional Carbon Nanotubes and Misaligned-Carbon-Nanotube-Immune Logic Structures," 2008 Symposium on VLSI Technology Digest of Technical Papers, 2008, pp. 205-206, IEEE.

Paul, Bipul C. et al., "Modeling and Analysis of Circuit Performance of Ballistic CNFET," Proc. Design Automation Conference, 2006, pp. 717-722, ACM.

Rachlin, Eric et al., "Nanowire Addressing with Randomized-Contact Decoders," Proc. Intl. Conf. CAD, 2006, ACM.

Rad, Reza M. P. et al., "A New Hybrid FPGA with Nanoscale Clusters and CMOS Routing," Proc. Design Automation Conference, 2006, pp. 727-730, ACM.

Rao, Wenjing et al., "Fault Tolerant Nanoelectronic Processor Architectures," Proc. Asia South Pacific Design Automation Conference, 2005, pp. 311-316.

Raychowdhury, Arijit et al., "Modeling of Ballistic Carbon Nanotube field Effect Transistors for Efficient Circuit Simulation," Proc. Intl. Conf. CAD, 2003, pp. 487-490, ACM.

Snider, Greg et al., "CMOS-Like Logic in Defective, Nanoscale Crossbars," Nanotechnology, 2004, pp. 881-891, vol. 15, United Kingdom, IOP Publishing Ltd.

Strukov, Dmitri B. et al., Defect-Tolerant Architectures for Nanoelectronic Crossbar Memories, Journal of Nanoscience and Nanotechnology, Aug. 2006.

Tahoori, Mehdi B., "Application-Independent Defect-Tolerant Crossbar Nano-Architectures," ACM Journal Emerging Technologies in Computing, 2006, ACM.

Wang, Zhanglei et al., "Using built-in Self-Test and Adaptive Recovery for Defect Tolerance in Molecular Electronics-Based Nanofabrics," Proc. International Test Conference, 2005, Paper 21.1, pp. 477-486, IEEE.

Wong, H.-S. P. et al., "Carbon Nanotube Field Effect Transistors—Fabrication, Device Physics, and Circuit Implications," Proc. 2003 IEEE International Solid-State Circuits Conference, 2003, pp. 370-371, IEEE.

Zhang, Guangyu et al., "Selective Etching of Metallic Carbon Nanotubes by Gas-Phase Reaction," Science, Nov. 10, 2006, pp. 974-977, vol. 314.

Zhang, Jie et al., "Design Guidelines for Metallic-Carbon-Nanotube-Tolerant Digital Logic Circuits," Design Automation and Test in Europe, 2008, EDAA.

Zhang, Rui et al., "Threshold/Majority Logic Synthesis and Concurrent Error Detection Targeting Nanoelectronic Implementations," Proc. Great Lakes Symposium on VLSI, 2006, pp. 8-13, ACM.

Zhao, Wei et al., "New Generation of Predictive Technology Model for Sub-45 nm Early Design Exploration," IEEE Transactions on Electron Devices, Nov. 2006, pp. 2816-2823, vol. 53, No. 11, IEEE.

Derycke, V. et al., "Carbon Nanotube Inter- and Intramolecular Logic Gates," Nano Letters, Sep. 2001, pp. 453-456, vol. 1, No. 9, American Chemical Society.

Non-Final Rejection mailed Jan. 5, 2011 for U.S. Appl. No. 12/240,409.

* cited by examiner

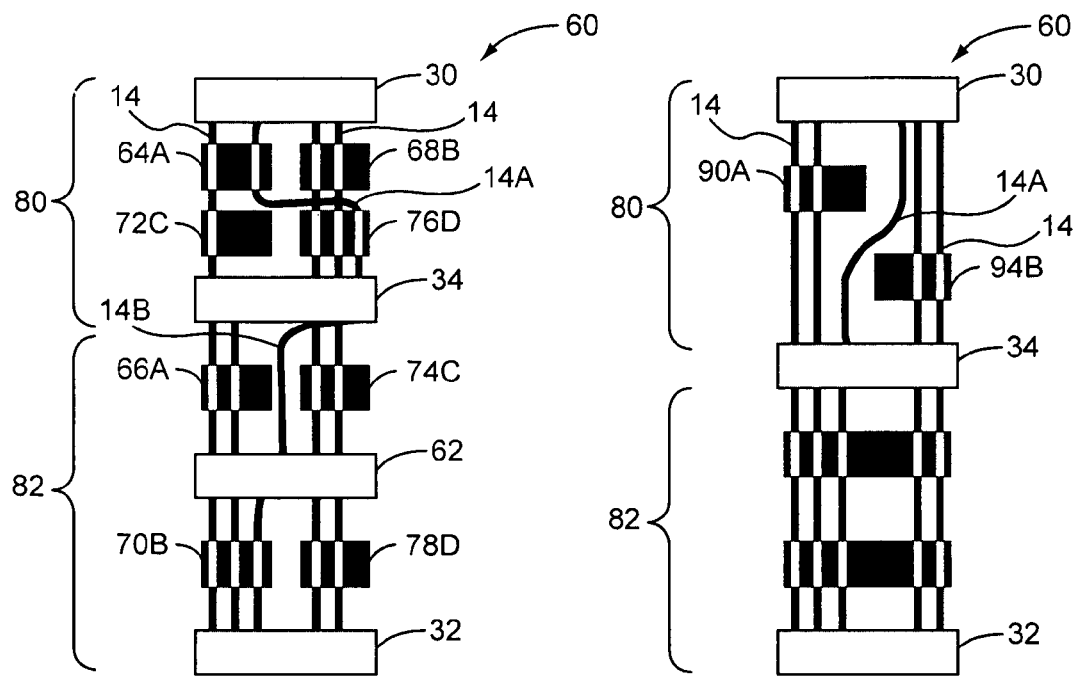
FIG. 3
FIG. 4
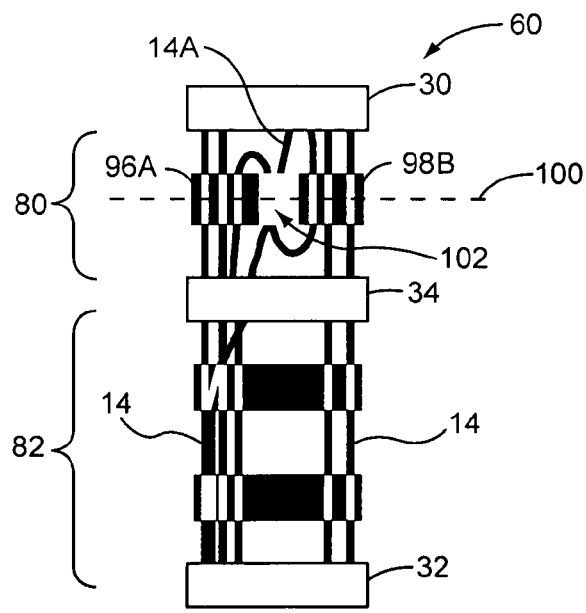
FIG. 5

NANOTUBE LOGIC CIRCUITS

This application claims the benefit of provisional patent application Ser. No. 60/976,135, filed Sep. 28, 2007, the disclosure of which is hereby incorporated herein by reference in its entirety.

This invention was made with government support under HR0011-07-3-0002 awarded by DARPA. The Government may have certain rights in this invention.

FIELD OF THE INVENTION

The present invention relates to the use of carbon nanotubes in logic circuits, and in particular to designing and forming logic circuits that are immune to misaligned or misplaced carbon nanotubes.

BACKGROUND OF THE INVENTION

There is increasing interest in the use of carbon nanotubes in electronic circuits, and in particular logic cells that are configured to perform inverting functions and any number of Boolean logic functions. An ideal carbon nanotube logic-based circuit can have significantly less fan-out-of-four (FO4) delay and significantly lower energy requirements than a conventional complementary metal oxide semiconductor (CMOS)-based circuit. Unfortunately, the current state of carbon nanotube manufacture results in a significant percentage of misaligned carbon nanotubes. A misaligned carbon nanotube can result in a short between contacts of a logic cell, or the inadvertent creation of an incorrect logic function. Because of the high misalignment rates, discarding defective chips with misaligned carbon nanotubes or reconfiguring around defective logic cells via testing may be very expensive. Traditional fault tolerance techniques, such as Triple Modular Redundancy (TMR), are expensive and may not be adequate for such high defect rates. Thus, there is a need for a circuit design that is not impacted, or is otherwise immune, to misaligned carbon nanotubes, and a verification methodology for determining whether an existing circuit design is immune to misaligned carbon nanotubes.

SUMMARY OF THE INVENTION

The present invention provides logic cells and methods for making logic cells that are immune to misaligned or mispositioned carbon nanotubes. A layer of carbon nanotubes is grown on or transferred to a substrate. The layer of carbon nanotubes includes nanotubes that are aligned generally parallel with respect to each other, and nanotubes that are not generally parallel with respect to those nanotubes that are aligned generally parallel with respect to each other. A plurality of cell nodes is formed on the substrate. The cell nodes can include input contacts, an output contact, and gate regions. The output contact is positioned between two input contacts, and a cell region is defined that is bounded by the width of the output contact and resides between the input contacts. The gate regions are positioned to provide a logic function. A nonconductive region is provided in the cell region between two of the cell nodes that, if shorted by a misaligned carbon nanotube, would inhibit the logic function of the logic cell.

According to one embodiment of the present invention, the nonconductive region is an undoped region and is formed by lithographically masking the nonconductive region while other regions of the logic cell are doped. The undoped region will not conduct, even if misaligned or mispositioned carbon nanotubes form an undesired connection between any two or more cell nodes. According to another embodiment of the present invention, the nonconductive region is an etched region devoid of carbon nanotubes. The nonconductive region is provided such that no carbon nanotubes can short two cell nodes such that an incorrect logic function is implemented.

According to one embodiment of the present invention, a logic cell implements a product of sums (POS) logic function, and each gate region is positioned along a line generally extending perpendicular to the carbon nanotubes. Nonconductive regions are provided between each gate region. The nonconductive regions are sized and positioned to prevent any carbon nanotubes from extending between an input contact and an output contact without going through at least one gate region or one nonconductive region, such that the input contact and the output contact cannot be shorted by a misaligned or mispositioned carbon nanotube.

According to another embodiment of the present invention, a logic cell includes two sum of product (SOP) logic arrangements, each SOP logic arrangement including a plurality of gates arranged in a line that is generally parallel to the carbon nanotubes. A nonconductive region is provided between the two SOP logic arrangements, is sized and positioned to prevent any conducting carbon nanotubes from extending between an input contact and an output contact without going through each of the respective gate regions of one of the SOP logic arrangements, and inhibits a short from one SOP logic arrangement to the other SOP logic arrangement.

According to yet another embodiment of the present invention, a method of determining whether a circuit design is immune to misaligned carbon nanotubes is provided. The cell design is divided into pull-up regions and pull-down regions. The pull-up region includes that portion of the cell that pulls the output contact to a high reference voltage based upon certain gate voltages, and the pull-down region includes that portion of the cell that pulls the output contact to a low reference voltage based upon certain gate voltages. Each region is then decomposed into a grid, the dimension of each unit in the grid being equal to a smallest lithography feature size. A graph is made having nodes that correspond to the units of the grid. Each node in the graph is provided one of the following labels: contact (C), doped (D), undoped (U), etched (E), or gate (G). Adjacent nodes that share an edge and have an identical label are combined into a single node, resulting in a reduced graph. Each node in the graph is designated a respective Boolean function. Each potential path through the nodes from the input contact to the output contact is determined. A Boolean function is applied to each of the Boolean functions associated with the nodes along each path, resulting in a Boolean path function for each potential path. The combination of Boolean path functions are compared to the intended logic function of the cell. If the combination of Boolean path functions of all the potential paths are equivalent to the intended logic function, that region of the cell is immune to misaligned nanotubes. If the combination of Boolean path functions of all potential paths are not equivalent to the intended logic function, then that region of the cell is not immune to misaligned carbon nanotubes.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 3 is a diagram of a logic cell where misaligned carbon nanotubes cause an incorrect logic function to be implemented;

FIG. 4 is diagram of a logic cell where misaligned carbon nanotubes cause an incorrect logic function to be implemented;

FIG. 5 is a diagram of a logic cell that is immune to misaligned carbon nanotubes according to one embodiment of the present invention;

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
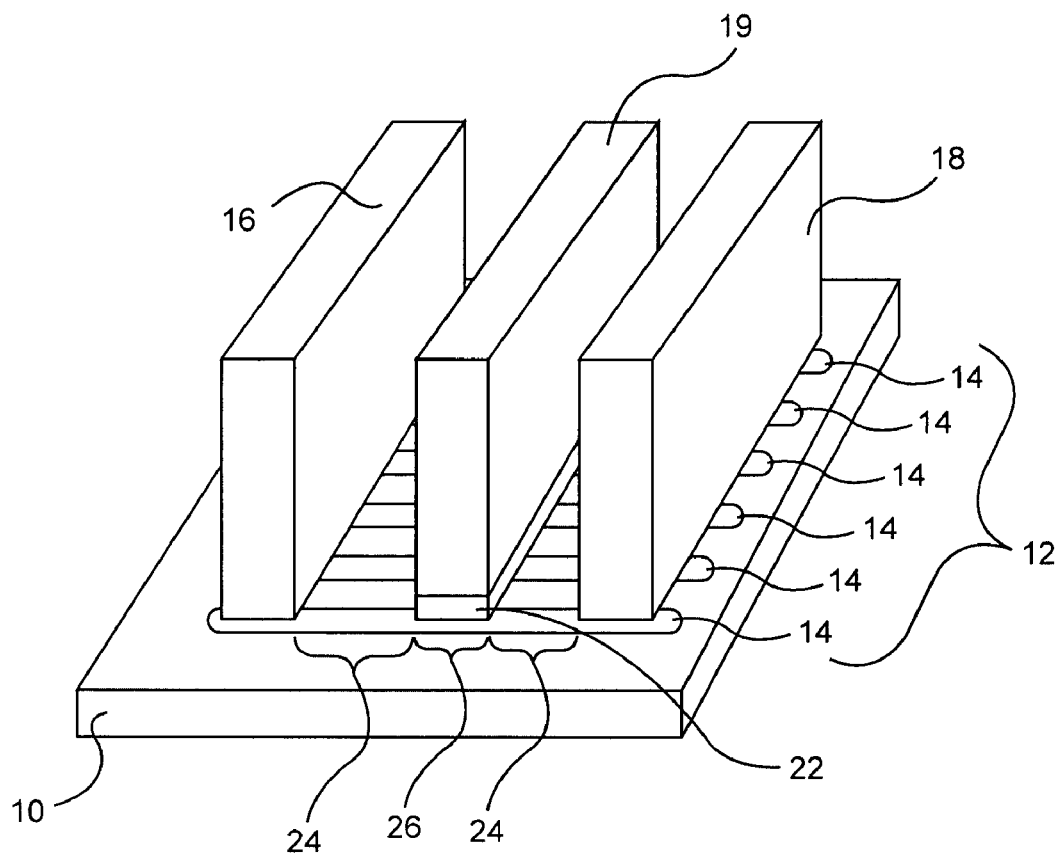
FIG. 1 is a diagram of a carbon nanotube field effect transistor (FET)

FIG. 1 is a diagram of a carbon nanotube field effect transistor (FET). A substrate 10 comprises any suitable substrate capable of bonding with a layer 12 of carbon nanotubes 14. According to one embodiment of the present invention, the substrate 10 comprises quartz. A source contact 16 and drain contact 18 contact the layer 12, and a gate contact 19 is positioned on an oxide 22 over a gate region 26 of the carbon nanotubes 14. The gate region 26 is typically a lightly doped region of carbon nanotubes, the conductivity of which is controlled by the gate contact 19. Portions 24 of the carbon nanotubes 14 extend between the source contact 16 and the gate region 26, and the drain contact 18 and the gate region 26, respectively. The portions 24 are n-doped if the carbon nanotube FET is an n-channel FET and are p-doped if the carbon nanotube FET is a p-channel FET. Doping portions of carbon nanotubes, such as the portions 24, is known to those skilled in the art, and will not be described in detail herein.

For purposes of illustration and clarity, the term 'gate' will generally refer to the gate contact and gate oxide or dielectric, and the phrase 'gate region' will refer to the region of carbon nanotubes under the respective gate whose conductivity is controlled by the gate. However, it will be understood that where only a gate is discussed, the gate has a corresponding gate region under the respective gate, and when discussing logic implemented by a logic cell or portions thereof, the term 'gate' will refer to the signal control implemented by the gate contact, gate dielectric, and gate region collectively. The term 'short' will refer to a carbon nanotube extending between two contacts, between two gate regions, or between a contact and a gate region that results in an incorrect logic function. Input contacts, output contacts, intermediate contacts, and gate regions may each be referred to herein as a 'cell node,' and may be referred to herein collectively as 'cell nodes,' and represent potential points in a logic cell that may be shorted by one or more carbon nanotubes.

Figure 2:
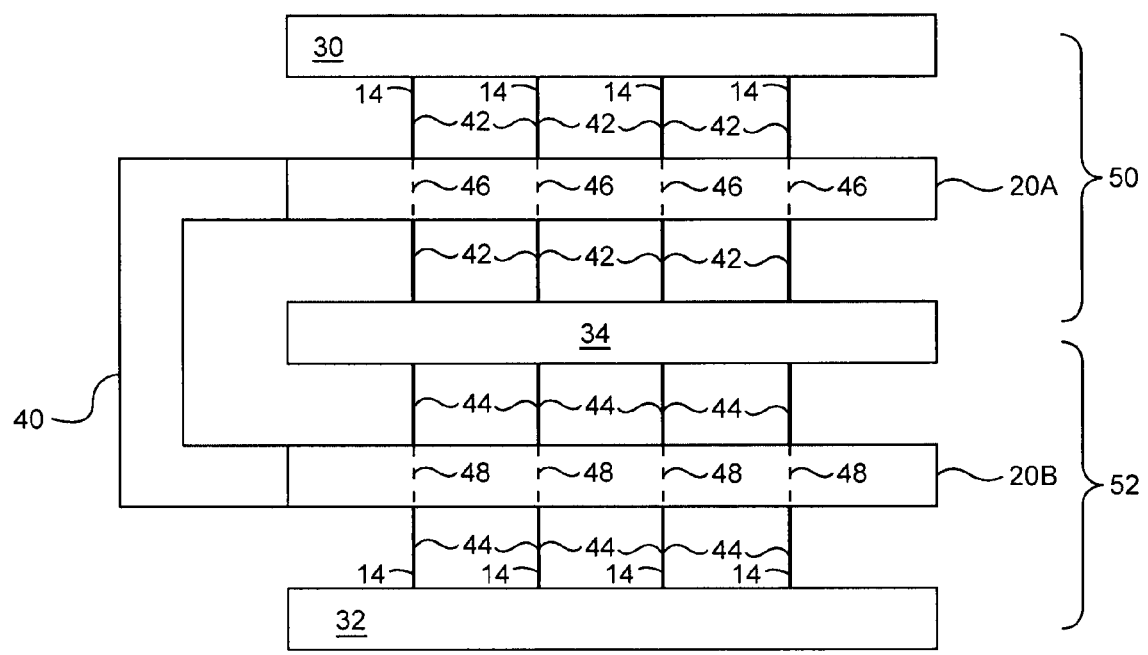
FIG. 2 is a diagram of an inverter logic cell made of carbon nanotube FETs.

FIG. 2 is a diagram of an inverter logic cell made of carbon nanotube FETs. A plurality of carbon nanotubes 14 extend between an input contact 30 and an output contact 34, and between an input contact 32 and the output contact 34. The phrase 'input contact' as used herein refers to a contact that provides a reference voltage, whether high or low, and the phrase 'output contact' refers to a contact used to provide a signal to a downstream circuit or device. A gate 20A is positioned between the input contact 30 and the output contact 34, and a gate 20B is positioned between the input contact 32 and the output contact 34. An interconnect 40 electrically connects the gate 20A and the gate 20B. Portions 42 of the carbon nanotubes 14 are p-doped, and portions 44 of the carbon nanotubes 14 are n-doped. Portions 46 of the carbon nanotubes 14 under the gate 20A are undoped or lightly doped, and portions 48 of the carbon nanotubes 14 under the gate 20B are undoped or lightly doped. A bracket 50 brackets the p-doped carbon nanotube FET portion of the inverter logic cell, which may be referred to herein as the 'pull-up' network, to reflect that when the gate 20A is closed, thereby completing the circuit between the input contact 30 and the output contact 34, the output contact 34 is 'pulled-up' to the high reference voltage of the input contact 30. A bracket 52 brackets the n-doped carbon nanotube FET portion of the inverter logic cell, which may be referred to herein as the 'pull-down' network, to reflect that when the gate 20B is closed, thereby completing the circuit between the input contact 32 and the output contact 34, the output contact 34 is 'pulled down' to the ground voltage of the input contact 32.

Throughout the specification the notation used to describe the logic function implemented by logic gates of a respective logic cell will be by the use of a plus sign "+" to indicate the OR function and an asterisk "*" or parenthesis "( )" to indicate the AND function. An apostrophe "'" will be used to describe the complement function. For example, the logic function A AND B AND NOT C will be notated as A*B*C'. The logic function A AND B OR C AND D will be notated (A*B)+(C*D). The use of the phrase 'Product of Sums (POS)' herein refers to a series of gates that are OR'ed together, and the use of the phrase 'Sum of Products (SOP)' herein refers to a series of gates that are AND'ed together. Explanations of logic functions herein will use the respective element reference character of the gate to indicate the role of the signal at that gate in determining the output signal of the logic function. If relevant to the discussion, gate element reference characters may also include an alphabetic character to show that some gates are coupled to the same signal. For example, a reference to Output ('OUT')=8A+10B+12A' indicates that gates 8 and 12 receive the same input signal, and gate 10 receives a different input than gates 8 and 12.

FIG. 3 is a diagram of a logic cell 60 where misaligned carbon nanotubes cause an incorrect logic function to be implemented. The logic cell 60 has input contacts 30 and 32 and an output contact 34. Gates 64A, 68B, 72C, and 76D implement the logic in a pull-up network 80 of the logic cell 60, and gates 66A, 70B, 74C, and 78D implement the logic in a pull-down network 82 of the logic cell 60. While the same element reference characters will generally be used in the figures to illustrate pull-up and pull-down networks, respectively, it will be understood that the logic functions implemented in the respective pull-up or pull-down networks will differ depending on the gate arrangement used in the respective pull-up or pull-down network. Similarly, while the same element reference characters will generally be used in the figures to illustrate logic cells, it will be understood that the logic functions implemented by the logic cells will differ depending on the logic implemented by the respective pull-up and pull-down networks associated with the respective logic cell. Gates that have the same alphabetic reference character are coupled to the same input signal. For example, the gates 64A and 66A are both coupled to the same input signal. An intermediate contact 62 couples the logic implemented by the gates 70B and 78D to the logic implemented by the gates 66A and 74C.

A plurality of carbon nanotubes 14 extend between the input contact 30 and the output contact 34, and between the input contact 32 and the output contact 34. The intended logic function of the pull-up network 80 of the logic cell 60 is OUT=(64A'*72C')+(68B'*76D'). Note that the logic values associated with the input at the gates 64A, 68B, 72C, and 76D is complemented because the gate regions associated with such gates are formed in a p-doped carbon nanotube FET, wherein the gate region provides a conductive path when the associated input to the gate is a low, or zero, signal. Note that a misaligned carbon nanotube 14A extends between the input contact 30 and the output contact 34 under the gate 76D rather than under the desired gate 72C. Consequently, the actual logic function implemented by the logic gates in the pull-up network 80 is OUT=(64A'*76D')+(68B'*76D')+(64A'*72C'). The use of the term 'misaligned' encompasses carbon nanotubes 14 that extend under unintended gates, short contacts, or otherwise extend in a manner or direction that is not desirable, irrespective of how such carbon nanotubes 14 were grown or positioned on the substrate 10 (FIG. 1). Accordingly, 'misaligned' includes mispositioned carbon nanotubes.

The intended logic function of the pull-down network 82 of the logic cell 60 is OUT=(66A+74C)*(70B+78D). Due to a misaligned carbon nanotube 14B that causes a short between the output contact 34 and the intermediate contact 62, the actual logic function that is implemented is OUT=(70B+78D).

FIG. 4 is diagram of a logic cell 60 where misaligned carbon nanotubes 14 cause an incorrect logic function to be implemented. The desired logic function implemented in the pull-up network 80 of the logic cell 60 is OUT=(90A'+94B'). Due to the misaligned carbon nanotube 14A, there is a short between the input contact 30 and the output contact 34.

FIG. 5 is a diagram of a logic cell 60 according to one embodiment of the present invention that is immune to misaligned carbon nanotubes 14. The desired logic function implemented by the pull-up network 80 of the logic cell 60 is OUT=96A'+98B'. Note that gates 96A and 98B are positioned along a line 100 extending generally perpendicular to the majority of the carbon nanotubes 14. A nonconductive region 102 is positioned between the input contact 30 and the output contact 34, and also in between the gates 96A and 96B. Note that the nonconductive region 102 is positioned between the input contact 30 and the output contact 34 to prevent a short between the input contact 30 and the output contact 34. According to one embodiment of the present invention, the nonconductive region 102 is created by masking the nonconductive region 102 during the doping processes, so that the nonconductive region 102 comprises an undoped region of misaligned carbon nanotubes 14. Because any carbon nanotube 14 passing under or through the nonconductive region 102 is undoped, it will not conduct electricity and will not upset the intended logic function of the logic cell 60. According to another embodiment of the present invention, the nonconductive region 102 comprises an etched region that is devoid of carbon nanotubes 14. Because of the nonconductive region 102, the pull-up network 80 implements the intended logic function, OUT=96A'+96B'.

Figure 6:
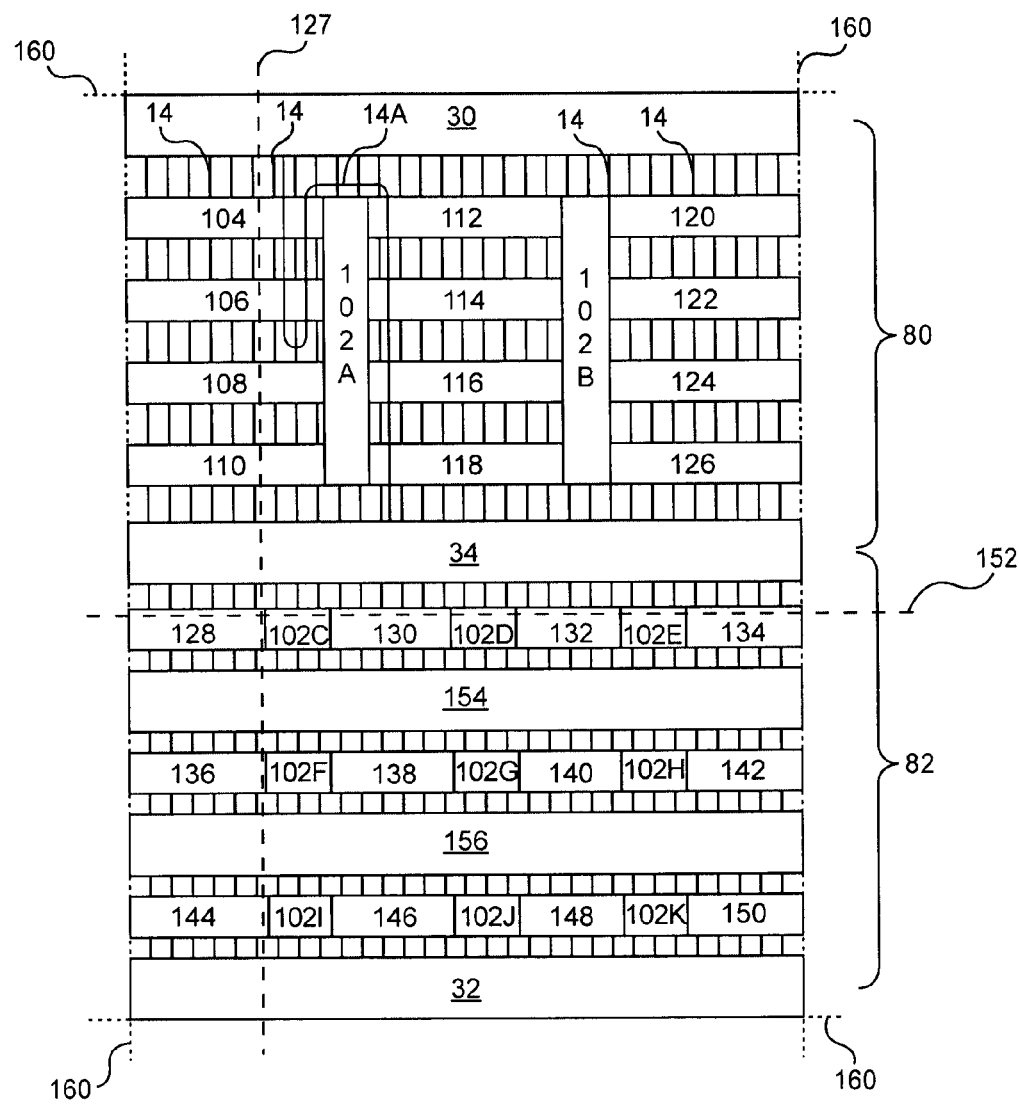
FIG. 6 is a diagram of a logic cell that is immune to misaligned carbon nanotubes according to another embodiment of the present invention.

FIG. 6 is a diagram of a logic cell 60 according to one embodiment of the present invention. The pull-up network 80 includes a plurality of carbon nanotubes 14 extending between the input contact 30 and the output contact 34. A series of gates 104, 106, 108, and 110 are arranged in a SOP arrangement. A second series of gates 112, 114, 116, and 118, and a third series of gates 120, 122, 124, and 126 are also arranged in a SOP arrangement. The desired logic function implemented by the pull-up network 80 is OUT=(104'* 106'*108'*110')+(112'*114'*116'*118')+(120'*122'*124'* 126'). Note that the series of gates 104-110 are positioned between the input contact 30 and the output contact 34 along a line 127 that extends generally parallel to the carbon nanotubes 14. Likewise, the series of gates 112-118 are also positioned between the input contact 30 and the output contact 34 parallel to the line 127 that extends generally parallel to the carbon nanotubes 14. A nonconductive region 102A is positioned between the input contact 30 and the output contact 34 and separates the gate regions of the series of gates 104-110 from the gate regions of the series of gates 112-118. Thus, the nonconductive region 102A is sized and positioned to prevent a short between the series of gate regions associated with gates 104-110 and the series of gate regions associated with gates 112-118, as well as between the input contact 30 and the output contact 34. Note that the nonconductive region 102A need not prevent the carbon nanotube 14A from passing through the gate regions associated with gates 104 and 106 of one of the SOP arrangements and then through the gate regions associated with all the gates 112-118 of the other SOP arrangement, because the carbon nanotube 14A passes through at least all of the gate regions associated with gates 112-118 of one SOP arrangement, and therefore cannot implement an incorrect logic function.

A nonconductive region 102B is also positioned between the input contact 30 and the output contact 34 and separates the series of gate regions associated with gates 112-118 from the series of gate regions associated with gates 120-126. Thus, the nonconductive region 102B is sized and positioned to prevent a short between the series of gate regions associated with gates 112-118 and the series of gate regions associated with gates 120-126, as well as between the input contact 30 and the output contact 34. Thus, the nonconductive regions 102A and 102B are sized and positioned to prevent a short between any gate regions that would inhibit the desired logic function.

The pull-down network 82 includes a series of gates 128, 130, 132, and 134 arranged in a POS arrangement. A series of gates 136, 138, 140, and 142 is also arranged in a POS arrangement, as is a series of gates 144, 146, 148, and 150. The intended logic function implemented by the pull-down network 82 is OUT=(128+130+132+134)*(136+138+140+142)*(144+146+148+150). Note also that each series of gates arranged in a POS arrangement is positioned between the output contact 34 and the input contact 32 and extends generally parallel to a line 152 that runs generally perpendicular to the carbon nanotubes 14. Nonconductive regions 102C-102K are positioned adjacent respective gates. An intermediate contact 154 is positioned between the gates 128-134 and the gates 136-142, and an intermediate contact 156 is positioned between the gates 136-142 and the gates 144-150. The intermediate contacts 154 and 156 ultimately provide a conductive path from the input contact 32 to the output contact 34 based on the gate inputs. Thus, the intermediate contacts 154 and 156 may be either an input contact or an output contact relative to an adjacent contact. Thus, each nonconductive region 102C-102K is positioned between an input contact and an output contact, and between two respective gate regions, and each nonconductive region 102C-102K prevents a short between two cell nodes that would inhibit the desired logic function.

According to one embodiment of the present invention, a cell region is defined that is bounded by a width of the output contact 34 and between the input contact 30 and the input contact 32. The cell region shown in FIG. 6 is defined by lines 160. During the manufacture of the logic cell 60, areas outside the cell region may be made nonconductive. The present invention relates to providing nonconductive regions within the cell region bounded by the lines 160 and between cell nodes such that if the two cell nodes were shorted, the intended logic function would be inhibited. By providing the nonconductive regions in such a manner, misaligned carbon nanotubes do not cause shorts or result in incorrect logic functions.

Figure 7:
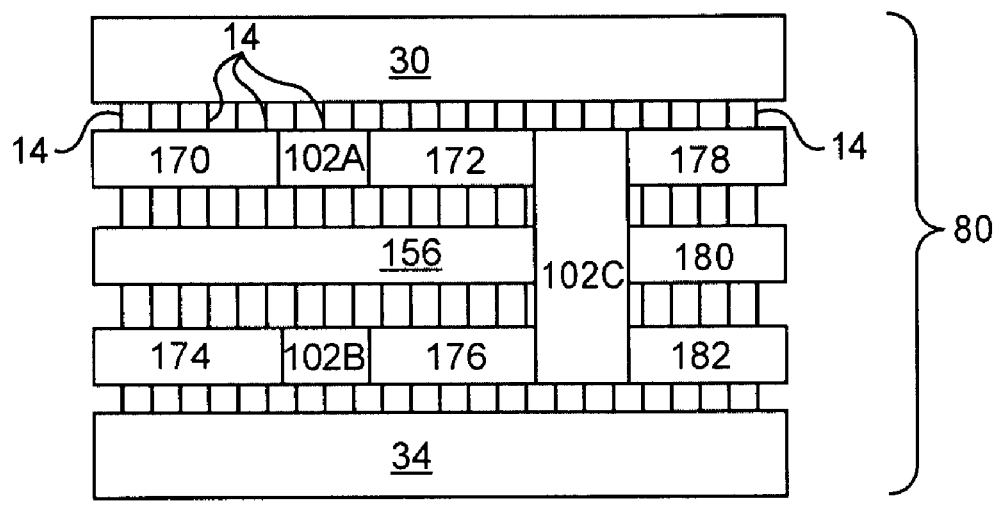
FIG. 7 is a diagram of a pull-up network according to one embodiment of the present invention.

FIG. 7 is a diagram of a pull-up network according to one embodiment of the present invention. The pull-up network 80 implements a combination of SOP logic and POS logic. Gates 170 and 172 and gates 174 and 176 are positioned in a POS arrangement. Gates 178, 180, and 182 are positioned in a SOP arrangement. The intended logic function implemented by the pull-up network 80 is OUT=(170'+172')*(174'+176')+(178'*180'*182'). A nonconductive region 102A is positioned between the input contact 30 and the intermediate contact 156, and between the gate regions associated with gates 170 and 172. A nonconductive region 102B is positioned between intermediate contact 156 and output contact 34 and between the gate regions associated with gates 174 and 176. A nonconductive region 102C is positioned between the series of gate regions associated with SOP gates 178-182 and the gate regions associated with the POS series of gates 170 and 172 and 174 and 176.

Figure 8A:
FIGS. 8A-8G are diagrams illustrating the stages of a pull-up network of a logic cell during a manufacturing process according to one embodiment of the present invention.

FIGS. 8A-8G are diagrams illustrating the stages of a pull-up network of a logic cell during a manufacturing process according to one embodiment of the present invention. For purposes of illustration, only the pull-up network portion of the logic cell will be discussed, but it will be apparent that the manufacturing process would typically implement an entire logic cell. Referring to FIG. 8A, a plurality of semiconducting carbon nanotubes 14 are provided on a substrate. The carbon nanotubes 14 can be grown on the substrate or transferred to the substrate. The substrate can comprise any suitable substrate and, according to one embodiment of the present invention, comprises quartz. Carbon nanotubes 14 can be grown on quartz using ferritin or iron as a catalyst.

Figure 8B:
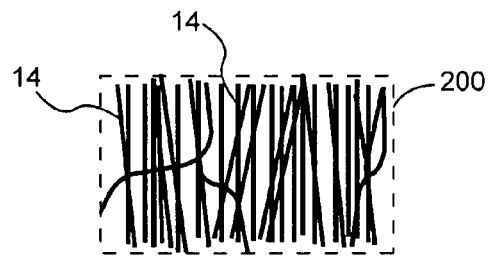
Figure 8C:
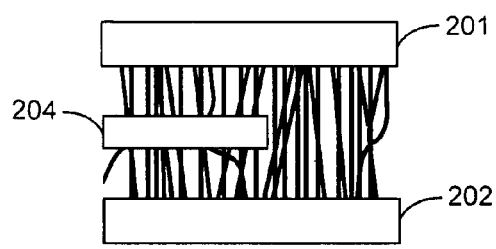
Figure 8D:
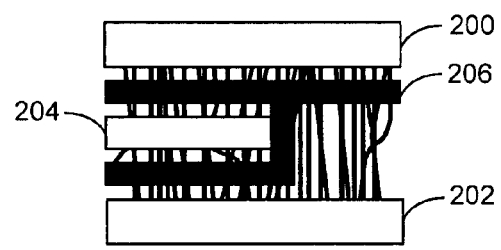
Figure 8E:
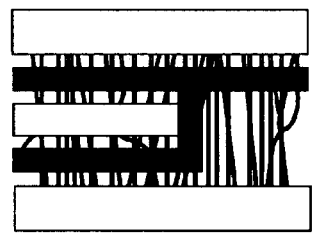
Figure 8F:
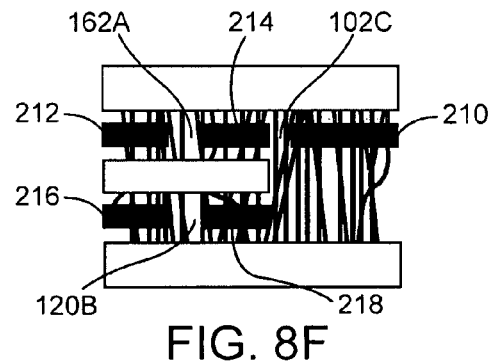
Figure 8G:
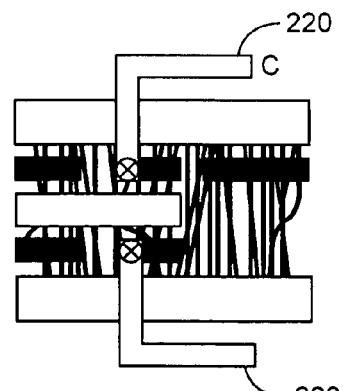

Referring to FIG. 8B, a boundary 200 that defines the logic cell region can be determined and defined using lithography techniques known to those skilled in the art. Areas outside the logic cell boundary 200 can be etched. Again, FIG. 8B shows only the pull-up network portion of the logic cell and ordinarily the boundary 200 would encompass the complete logic cell. Referring to FIG. 8C, an input contact region 201, an output contact region 202, and an intermediate contact region 204 are defined using lithography. Referring to FIG. 8D, a combined gate and nonconductive region 206 is defined using lithography. The combined gate and nonconductive region 206 encompass each region that will ultimately become either a gate region or a nonconductive region. Referring to FIG. 8E, the cell is doped appropriately. Note that the portions of the carbon nanotubes 14 that are positioned under the combined gate and nonconductive region 206 remain undoped. Referring to FIG. 8F, regions of the combined gate and nonconductive region 206 are etched away to create gate regions 210, 212, 214, 216, and 218. Note that masking the appropriate regions during the doping processes created the nonconductive regions 102A, 102B, and 102C. In an alternative embodiment, the nonconductive regions 102A, 102B, and 102C can be etched, for example, via the use of oxygen plasma. Referring to FIG. 8G, metal layers 220 and 222 can be defined using lithography techniques, along with any inter-layer dielectric, for interfacing with other logic cells.

Figure 9:
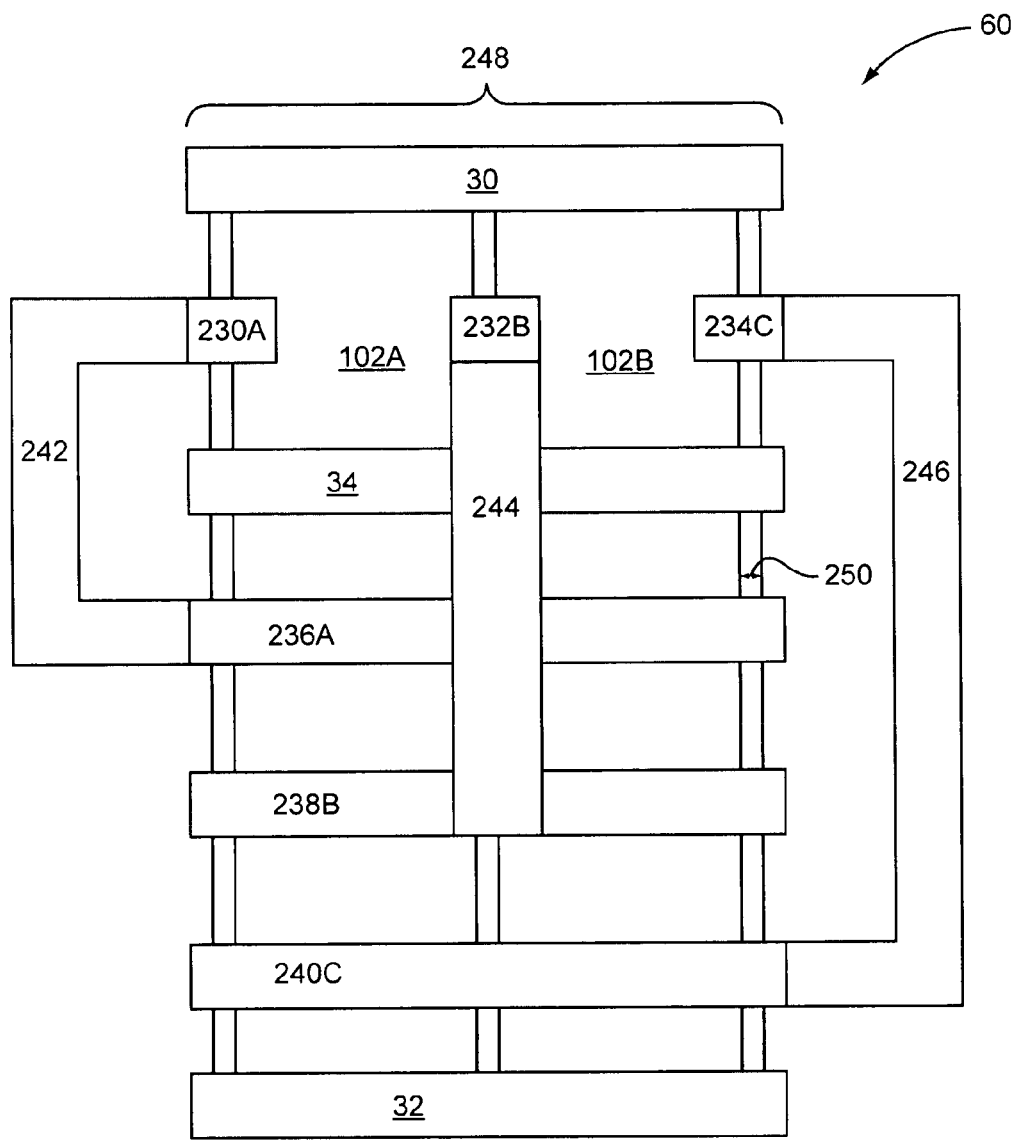
FIG. 9 is a top view of a completed logic cell according to one embodiment of the present invention.

FIG. 9 is a top view of a completed logic cell 60 according to one embodiment of the present invention. The carbon nanotubes 14 can be grown on a single crystal quartz using ferritin or iron as a catalyst. The input contact 30, the output contact 34, and the input contact 32 comprise Palladium. Gate oxides (not shown) comprise Hafnium Oxide, and gates 230A, 232B, 234C, 236A, 238B, and 240C comprise Platinum. The contacts, gate oxides, and gates were defined using photolithography techniques. The carbon nanotubes 14 were etched away from the nonconductive regions 102A and 102B. Metallic carbon nanotubes, which may be produced during the carbon nanotube growth phase, were removed using electrical breakdown. Interconnects 242, 244, and 246 comprise metal wires defined using photolithography. A dimension 248 defining the width of the logic cell 60, not including the interconnects 242, 244, and 246, is approximately 160 nanometers. A dimension 250 defining a distance between carbon nanotubes 14 is approximately 4 nanometers. The logic cell 60 implements a three-input NAND logic function. The logic function for the pull-up network 80 is OUT=(230A'+232B'+234C'). The logic function for the pull-down network 82 is OUT=(236A*238B*240C).

Figure 10:
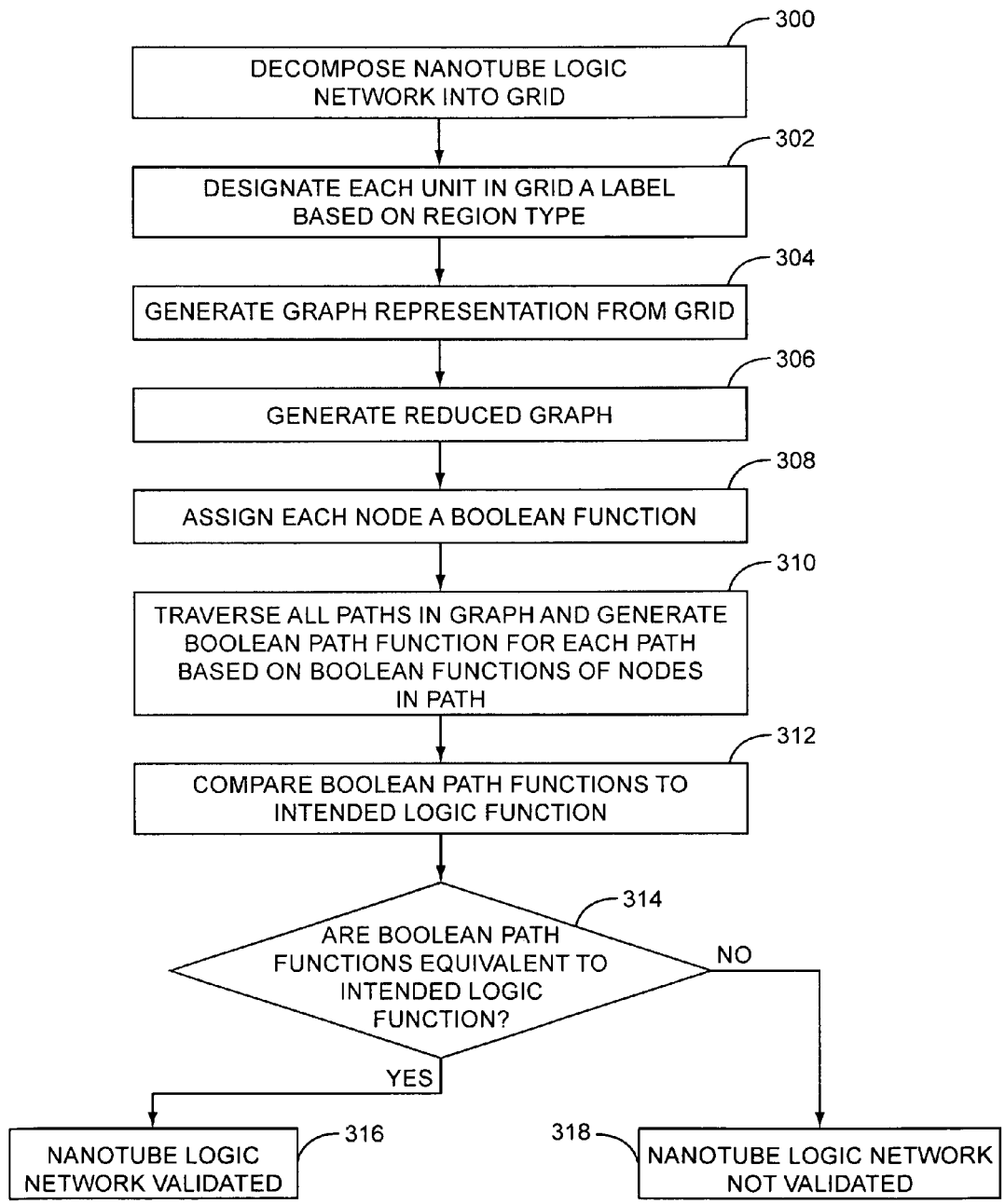
FIG. 10 is a flow chart illustrating a process for validating a nanotube logic network according to one embodiment of the present invention.

According to another embodiment of the present invention, a nanotube logic network, such as a pull-up network or a pull-down network, can be analyzed and, if certain conditions are determined, validated as being immune to misaligned carbon nanotubes. FIG. 10 is a flow chart illustrating a process for validating a nanotube logic network according to one embodiment of the present invention. A cell layout is divided into pull-up networks and pull-down networks. Each network is decomposed into a grid, the dimension of each unit in the grid being equal to a smallest lithography feature size of a mask used to make the respective network (step 300). Each unit in the grid is provided one of the following labels: contact (C), doped (D), undoped (U), etched (E), or gate (G) based on a conductivity associated with the respective unit (step 302). A graph is generated from the grid by representing each unit as a node, and representing each potential path of a carbon nanotube from one unit to another unit as an edge (step 304). Edges are represented in a graph as a line or an arrow. A reduced graph is then generated from the graph by consolidating each node that shares an edge with a node of the same label (step 306). Each node in the reduced graph is then designated a respective Boolean function based on a conductivity associated with the type of region represented by the node (step 308). Those nodes that represent a gate are assigned a variable, such as "A," to represent a variable conductivity based on an input signal at the respective gate. Each potential path through the nodes from the input contact node to the output contact node is determined, and a Boolean function is applied to each of the Boolean functions associated with each adjoining node along each path, generating a Boolean path function for each separate path (step 310). The Boolean path function of each potential path is then compared to the intended logic function of the respective nanotube logic network (step 312). If the Boolean path functions are equivalent to the intended logic function (step 314), then that region of the cell is immune to misaligned nanotubes (step 316). Otherwise, that region of the cell is not immune to misaligned nanotubes (step 318).

Figure 11A:
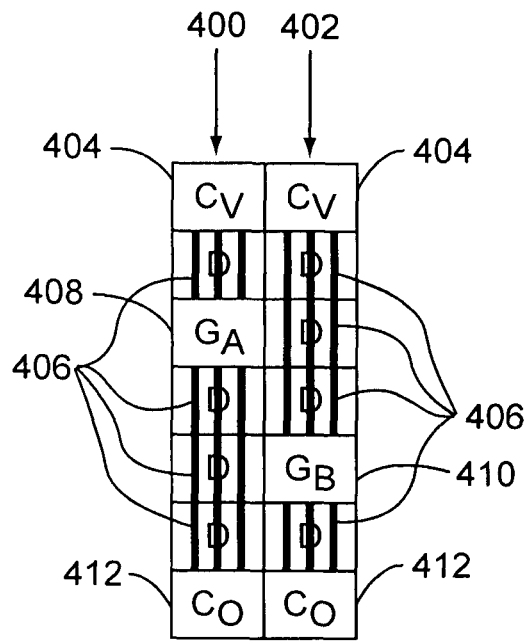
FIGS. 11A-11D illustrate grid decompositions of the logic cells shown in FIGS. 4 and 5.
Figure 11B:
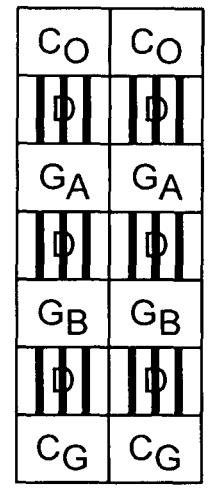
Figure 11C:
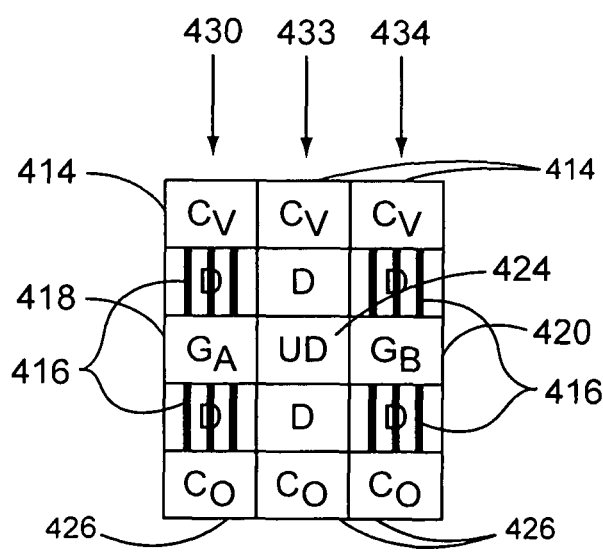
Figure 11D:
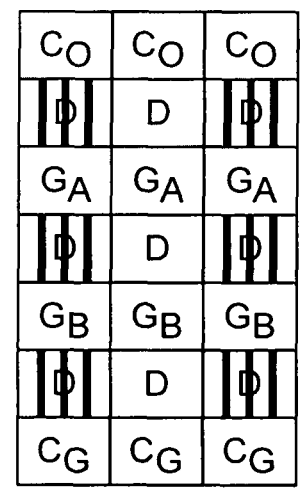

FIG. 11A shows a grid decomposition of the pull-up network 80 of the logic cell 60 illustrated in FIG. 4. The grid includes two columns 400 and 402. The width of the columns 400 and 402 is determined by the minimum size that can be defined using lithography. Each unit in the grid corresponds to a region of the pull-up network 80 and represents a potential path of a carbon nanotube. Units of identical regions are labeled identically. For example, units 404 are labeled "$C_V$" to represent each unit is a Vdd contact, units 406 are labeled "D" to represent each unit is a doped region, unit 408 is labeled "$G_A$," to represent a gate with input variable A, unit 410 is labeled "$G_B$" to represent a gate with input variable B, and units 412 are labeled "$C_O$" to represent each unit is an output contact. FIG. 11B shows a similar grid decomposition of the pull-down network 82 of the logic cell 60 illustrated in FIG. 4. FIG. 11C is a grid decomposition of the pull-up network 80 shown in FIG. 5. Because the logic cell 60 shown in FIG. 5 has a greater width than the logic cell 60 shown in FIG. 4, there are three columns 432, 434, and 436 of units. Each unit is labeled in a corresponding manner as discussed with regard to FIG. 11A. Units 414 are labeled "$C_V$," units 416 are labeled "D," unit 418 is labeled "$G_A$," and unit 420 is labeled "$G_B$." Unit 424 is labeled "UD" to represent an undoped region. FIG. 11D shows a similar a grid decomposition of the pull-down network of the logic cell 60 shown in FIG. 5.

Figure 12A:
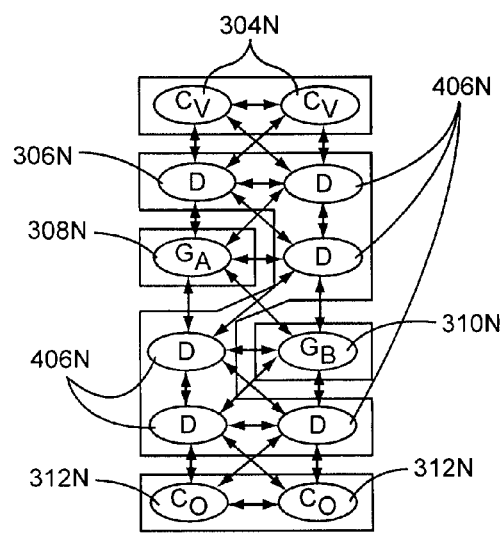
FIGS. 12A-12D illustrate graph representations of the grid decompositions illustrated in FIGS. 11A-11D.
Figure 12B:
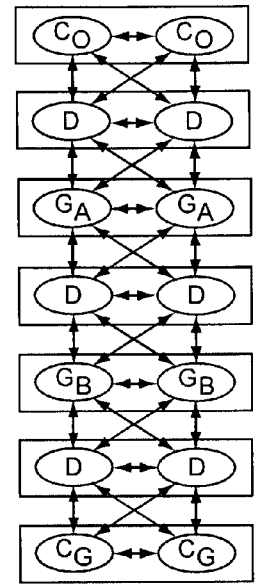
Figure 12C:
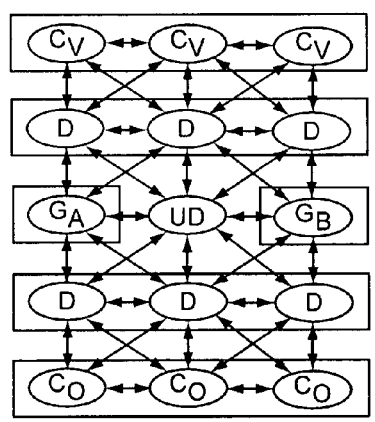
Figure 12D:
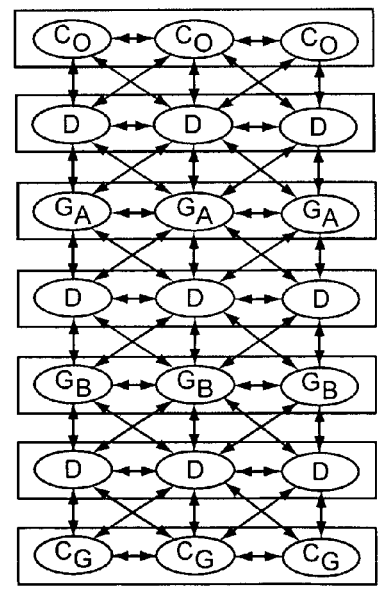

FIG. 12A is a graph representation of FIG. 11A. Each unit shown in FIG. 11A is represented in FIG. 12 as a node in the graph. For example, nodes 404N correspond to the units 404 in FIG. 11A, nodes 406N correspond to the units 406, node 408N corresponds to the unit 408, node 410N corresponds to the unit 410, and nodes 412N correspond to the unit 412. An edge exists between any two nodes in FIG. 12A for which the corresponding units in FIG. 11A have a boundary or vertex in common. Two nodes with an edge between them are referred to as neighboring nodes. Because a carbon nanotube can grow from any unit shown in the grid decomposition in FIG. 11A to an adjacent unit, any potential carbon nanotube path can be represented in the corresponding graph shown in FIG. 12A by representing all possible directions in which a carbon nanotube can grow with arrows between the nodes. FIGS. 12B-12D are graph representations corresponding to the grid decompositions shown in FIGS. 11B-11D, respectively.

Figure 13A:
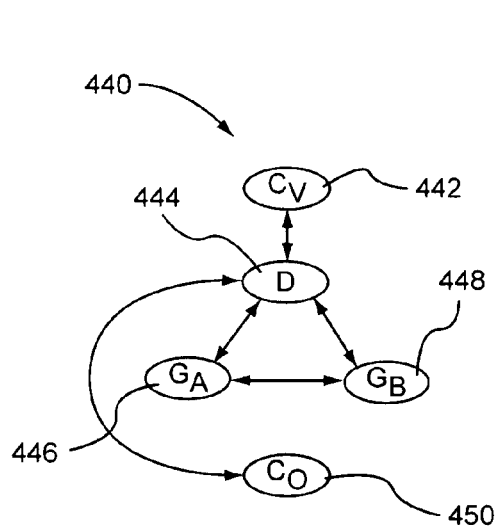
FIGS. 13A-13D illustrate reduced graphs of the graph representations shown in FIGS. 12A-12D.

FIG. 13A is a reduced graph 440 of the graph shown in FIG. 12A. FIG. 13A was reduced by combining neighboring nodes of FIG. 12A with the same label into a combined node. The combined node represents a union of the constituent nodes. For example, node 442 represents the nodes 404N from FIG. 11A, node 444 represents the nodes 406N from FIG. 11A, node 446 represents the node 408N from FIG. 11A, node 448 represents the node 410N from FIG. 11A, and node 450 represents the nodes 412N from FIG. 11A. Because the combined nodes in FIG. 12A represents the potential paths of a carbon nanotube through the regions of the corresponding pull-up network 80 of the logic cell 60 illustrated in FIG. 4, Boolean functions can be performed using the reduced graph shown in FIG. 12A to determine if any potential path of a carbon nanotube would constitute a short between input contacts, output contacts, or gate regions that would inhibit the intended logic function. First, each node in the graph is assigned a function, as shown in the table below.

| Node Type | Node Label | Boolean Function |
| --- | --- | --- |
| Gate with input variable A | $G_A$ | A |
| Gate with input variable A' | $G_{A'}$ | A' |
| Doped Region | D | 1 |
| Undoped Region | UD | 0 |
| Etched Region | E | 0 |
| Vdd contact | $C_V$ | 1 |
| Gnd contact | $C_G$ | 1 |
| Output contact | $C_O$ | 1 |
| Any intermediate contact | C | 1 |

As illustrated in the table, a node associated with a gate region has an associated function identified by the gate label. Nodes representing doped regions have a function of "1" because doped regions always conduct electricity. Nodes associated with undoped regions and etched regions have a function of "0" because such regions are nonconductive regions. Nodes associated with input contacts, output contacts and intermediate contacts have a function of "1" because such contacts always conduct. Nodes associated with gates are assigned a variable because the conductivity of the respective gate is variable depending on a voltage at the gate.

To determine whether the pull-up network 60 associated with the graph shown in FIG. 13A is immune to misaligned carbon nanotubes, each possible path between the $C_V$ node and the $C_O$ node is traversed. For a pull-down network 82, the Boolean path function associated with each potential path is compared to the complement of the intended logic function implemented by the pull-down network 82. For a pull-up network 80, DeMorgan's Law is applied to the intended logic function and the variables are complemented to simplify the analysis. The Boolean path function associated with each path is obtained by logically AND'ing the Boolean functions associated with each node along the path. This is because the Boolean path function of a path represents a switch level function implemented by a carbon nanotube traversing the path. For example, referring to FIG. 13A, a potential path through the graph 440 is $C_V$, D, $C_O$. Assigning Boolean functions from the table to each node results in (1*1*1). The value of this Boolean path function is 1. Another potential path is $C_V$, D, G+, D, $C_O$. Assigning Boolean functions from the table to each node results in (1*1*A*1*1). The value of this Boolean path function is A. For paths that have loops, each loop is traversed only once because the Boolean path function associated with the path will not change with multiple traversals of the same loops. The following represents all the paths through the graph 440. $C_V$-D-$C_O$=(1*1*1)=1; $C_V$-D-$G_A$-D-$C_O$=(1*1*A*1*1)=A; $C_V$-D-$G_B$-D-$C_O$=(1*1*B*1*1)=B; $C_V$-D-$G_A$-$G_B$-D-$C_O$=(1*1*A*B*1*1)=(A*B). The resulting Boolean path functions from each path traversal are then OR'ed together to create a combined Boolean path function. If the combined Boolean path function is equivalent to the intended logic function of the respective network, then the network is immune to misaligned carbon nanotubes. If the combined Boolean path function is not equivalent to the intended logic function then the network is not immune to misaligned carbon nanotubes. OR'ing the Boolean path functions derived above results in the following combined Boolean path function (1+A+B+(A*B)). After applying DeMorgan's Law and complementing the input variables A and B associated with the respective gates, the intended logic function of the pull-up network 80 associated with the graph 440 is (A+B). Since the logic function (A+B) is not equivalent to (1+A+B+(A*B)), the cell layout represented by the graph 440 is not immune to misaligned carbon nanotubes.

Figure 13B:
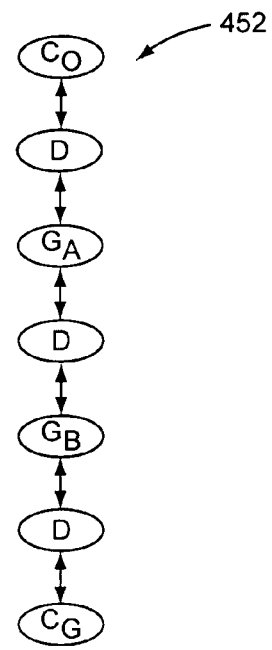

Referring to FIG. 13B, a graph 452 is a reduced graph of the graph shown in FIG. 12B. The graph 452 represents all possible paths of a carbon nanotube through the pull-down network 82 shown in FIG. 4. As reflected by the graph 452, the only potential path through the graph is $C_O$-D-$G_A$-D-$G_B$-D-$C_G$. Assigning the associated Boolean function from the table above to each node in the path results in a Boolean path function of (1*1*A*1*B*1*1), which is equivalent to (A*B). The complement of the intended logic of the pull-down network 82 shown in FIG. 4 is (A*B). Since (A*B) is equivalent to (A*B), the cell layout represented by the graph 452 is immune to misaligned carbon nanotubes.

Figure 13C:
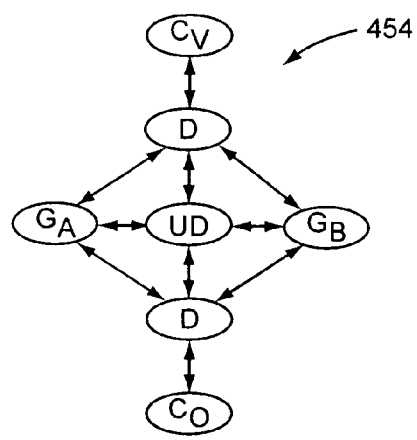

FIG. 13C shows a graph 454 which is a reduced graph of the graph shown in FIG. 12C. The graph 454 represents the pull-up network 80 of the logic cell 60 shown in FIG. 5. AND'ing the Boolean functions assigned to the nodes in the graph 454 in accordance with the table above, and traversing all potential paths of the graph 454, and OR'ing the resulting Boolean path functions results in a combined Boolean path function of (A+B+(A*B) or 0). Applying DeMorgan's Law and complementing the value of the input variables to the respective gates of the pull-up network 80 shown in FIG. 5 results in an intended logic function of (A+B). Since (A+B+(A*B) or 0) is equivalent to (A+B), the cell layout associated with the graph 454 is immune to misaligned nanotubes.

Figure 13D:
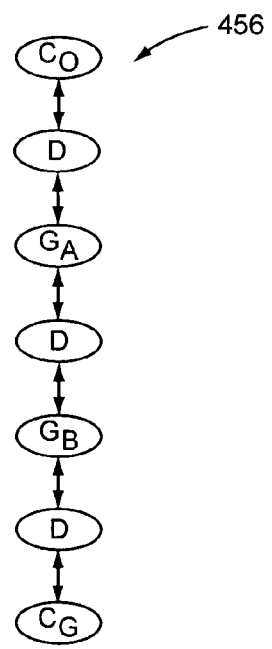

FIG. 13D shows a graph 456 which is a reduced graph of the graph shown in FIG. 12D. The graph 456 represents the pull-down network 82 of the logic cell 60 shown in FIG. 5. AND'ing the Boolean functions assigned to the nodes in the graph 456 in accordance with the table above, and traversing the one potential path of the graph 456 results in a Boolean path function of (A*B). The complement of the intended logic of the pull-down network 82 shown in FIG. 5 is (A*B). Since (A*B) is equivalent to (A*B), the cell layout represented by the graph 334 is immune to misaligned carbon nanotubes.

Figure 14:
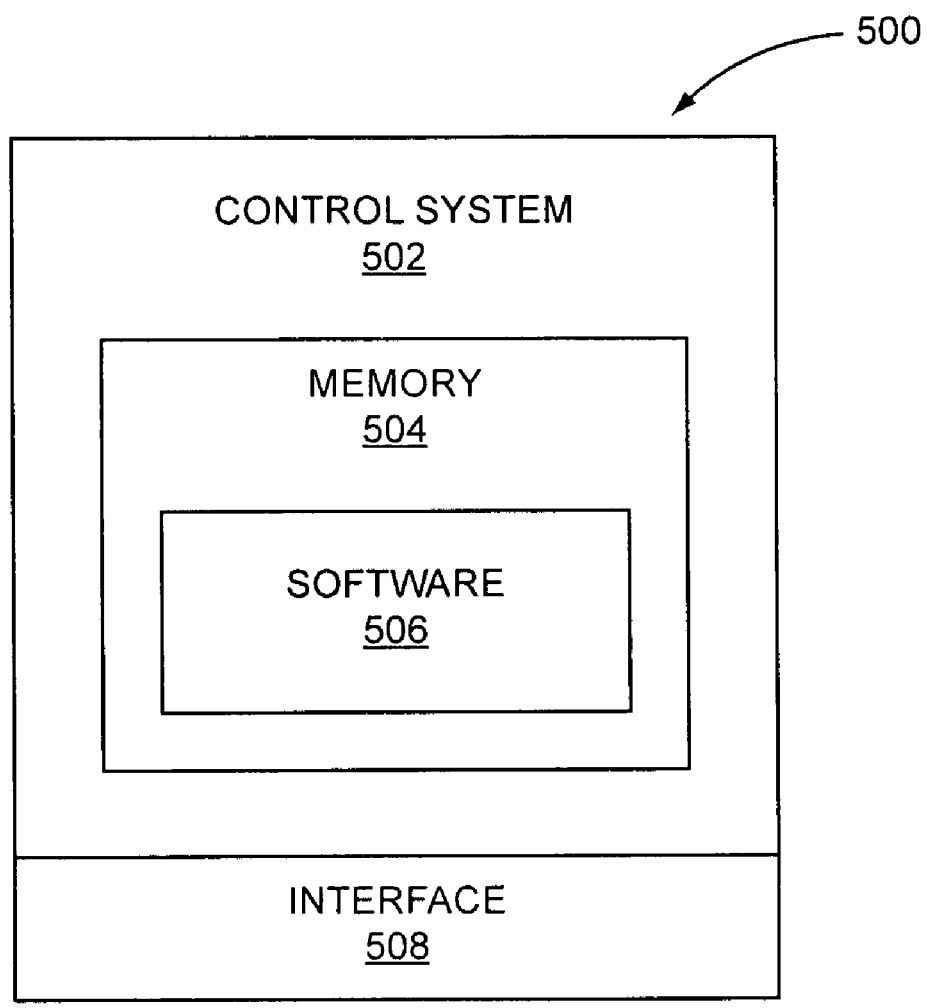
FIG. 14 is a diagram of an apparatus suitable for implementing a process for validating a nanotube logic network according to one embodiment of the present invention.

FIG. 14 is an apparatus suitable for implementing a process for validating a nanotube logic network according to one embodiment of the present invention. An apparatus 500 can include a control system 502 that may comprise a general purpose or special purpose processor executing a conventional or proprietary operating system. The control system 502 includes a memory 504 that includes software 506 programmed to implement the functionality described herein. The software 506 can be written in any conventional programming language, including C, C++, or Java, for example. The control system 502 includes an interface 508 for receiving information from a network via a data communications link, or from a user via an input device. The interface 508 also can preferably output information over the data communications link, or via a conventional output device, such as a printer or a display device.

The process for validating a nanotube logic network according to one embodiment of the present invention comprises a computer-usable medium having computer-readable instructions stored thereon for execution by a processor to perform the functionality described herein. The computer-usable medium can comprise any suitable medium for storing computer instructions, such as but not limited to a compact disc (CD), a digital versatile disc (DVD), a hard disk drive, random access memory (RAM), or any other suitable memory device suitable for storing computer instructions.

Those skilled in the art will recognize improvements and modifications to the preferred embodiments of the present invention. All such improvements and modifications are considered within the scope of the concepts disclosed herein and the claims that follow.

What is claimed is:

1. A device comprising:
   a substrate;
   a layer of carbon nanotubes on the substrate comprising a first plurality of carbon nanotubes that are generally parallel with respect to one another, and at least one carbon nanotube that is misaligned with respect to the first plurality of carbon nanotubes;
   a logic cell formed from a portion of the layer of carbon nanotubes and comprising:
      a plurality of cell nodes formed in or on the layer of carbon nanotubes and comprising a first input contact, a second input contact, an output contact, a first gate region, and a second gate region, such that:
         the output contact is positioned between the first input contact and the second input contact, and wherein a cell region is bounded by a width of the output contact and resides between the first input contact and the second input contact;
         the first gate region is positioned between the first input contact and the output contact; and
         the second gate region is positioned between the second input contact and the output contact, and wherein the first gate region and the second gate region are positioned to provide a logic function; and
   at least one nonconductive region in the layer of carbon nanotubes, and positioned within the cell region and between any two or more of the plurality of cell nodes that, if shorted, would inhibit the logic function.

2. The device of claim 1 further comprising a second nonconductive region surrounding the cell region.

3. The device of claim 1 wherein the at least one nonconductive region comprises an etched region wherein carbon nanotubes within the etched region are etched away.

4. The device of claim 1 wherein the at least one nonconductive region comprises an undoped region.

5. The device of claim 1 further comprising a plurality of nonconductive regions within the logic cell, each of the plurality of nonconductive regions positioned between two of the plurality of cell nodes and positioned to prevent a short between the two of the plurality of cell nodes.

6. The device of claim 1 wherein portions of the first plurality of carbon nanotubes are doped to provide connections between two of the plurality of cell nodes, and portions of the first plurality of carbon nanotubes are undoped to prevent shorts between the two of the plurality of cell nodes.

7. The device of claim 1 wherein at least some of the first plurality of carbon nanotubes extend from the first input contact to the output contact through the first gate region, and a first portion of the at least some of the first plurality of carbon nanotubes extending between the first input contact and the first gate region and a second portion of the at least some of the first plurality of carbon nanotubes extending between the first gate region and the output contact are doped, and wherein a third portion of the at least some of the first plurality of carbon nanotubes extending through the first gate region are lightly doped.

8. The device of claim 1 wherein one of the first input contact and the output contact comprises an intermediate contact.

9. The device of claim 1 wherein the at least one carbon nanotube is in contact with at least one of the first plurality of carbon nanotubes on the substrate.

10. A logic circuit comprising:
a substrate;
a plurality of carbon nanotubes on the substrate;
a logic cell having a defined perimeter and formed from the plurality of carbon nanotubes and comprising:
a plurality of cell nodes formed in or on a layer of carbon nanotubes and comprising a first input contact, a second input contact, an output contact, a first gate region, and a second gate region, such that:
the output contact is positioned between the first input contact and the second input contact;
the first gate region is positioned between the first input contact and the output contact; and
the second gate region is positioned between the second input contact and the output contact, and wherein the first gate region and the second gate region are arranged to provide a logic function; and
at least one nonconductive region in the layer of carbon nanotubes, and positioned within a cell region and between the first input contact and the output contact and positioned to prevent a short between the first input contact and the output contact by any one of the plurality of carbon nanotubes.

11. The logic circuit of claim 10 wherein the at least one nonconductive region comprises an etched region wherein carbon nanotubes within the etched region are etched away.

12. The logic circuit of claim 10 wherein the at least one nonconductive region comprises an undoped region.

13. The logic circuit of claim 10 wherein portions of the plurality of carbon nanotubes are doped to provide connections between two of the plurality of cell nodes, and portions of the plurality of carbon nanotubes are undoped to prevent shorts between the two of the plurality of cell nodes.

14. The logic circuit of claim 10 further comprising a plurality of nonconductive regions within the logic cell, each of the plurality of nonconductive regions positioned between two of the plurality of cell nodes and positioned to prevent a short between any two of the plurality of cell nodes.

15. The logic circuit of claim 10 wherein at least some of the plurality of carbon nanotubes extend from the first input contact to the output contact through the first gate region, and a first portion of the at least some of the plurality of carbon nanotubes extending between the first input contact and the first gate region and a second portion of the at least some of the plurality of carbon nanotubes extending between the first gate region and the output contact are doped, and wherein a third portion of the at least some of the plurality of carbon nanotubes extending through the first gate region are lightly doped.

16. The logic circuit of claim 10, wherein the cell region is bounded by a width of the output contact.

17. A circuit for implementing a product of sums logic function comprising:
a substrate;
a layer of carbon nanotubes formed on the substrate comprising a plurality of carbon nanotubes extending generally parallel with respect to one another;
an input contact, an intermediate contact, an output contact, a first plurality of gate regions, and a second plurality of gate regions, the plurality of carbon nanotubes aligned generally parallel to a line extending through the input contact and the output contact, the first plurality of gate regions positioned between the input contact and the intermediate contact along a line extending generally perpendicular to the plurality of carbon nanotubes such that the first plurality of gate regions implements an OR logic function, and the second plurality of gate regions positioned between the intermediate contact and the output contact along the line extending generally perpendicular to the plurality of carbon nanotubes such that the second plurality of gate regions implements an OR logic function; and
a first plurality of nonconductive regions separating each of the first plurality of gate regions from each other and a second plurality of nonconductive regions separating each of the second plurality of gate regions from each other.

18. The circuit of claim 17 wherein the first plurality of nonconductive regions comprises etched regions wherein carbon nanotubes within the etched regions are etched away.

19. The circuit of claim 17 wherein the first plurality of nonconductive regions comprises undoped regions.

20. The circuit of claim 17 wherein a first portion of some of the plurality of carbon nanotubes extending between the input contact and one of the first plurality of gate regions is doped, and a second portion of the some of the plurality of carbon nanotubes extending between the one of the first plurality of gate regions and the output contact is doped, and wherein a third portion of the some of the plurality of carbon nanotubes extending through the one of the first plurality of gate regions is lightly doped.

21. A circuit for implementing a sum of products logic function comprising:
a substrate;
a layer of carbon nanotubes formed on the substrate comprising a plurality of carbon nanotubes extending generally parallel with respect to one another;
an input contact, an output contact, a first plurality of gate regions, and a second plurality of gate regions, the plurality of carbon nanotubes aligned generally parallel to a line extending through the input contact and the output contact, the first plurality of gate regions positioned between the input contact and the output contact along a line extending generally parallel to the plurality of carbon nanotubes such that the first plurality of gate regions implements an AND logic function, the second plurality of gate regions positioned proximate to the first plurality of gate regions and along the line extending generally parallel to the plurality of carbon nanotubes such that the second plurality of gate regions implements an AND logic function; and
a nonconductive region positioned between and separating the first plurality of gate regions from the second plurality of gate regions.

22. The circuit of claim 21 comprising a second plurality of carbon nanotubes that extends generally nonparallel to the plurality of carbon nanotubes.

23. A method for making a device comprising:
providing a substrate;
providing a layer of carbon nanotubes on the substrate comprising a first plurality of carbon nanotubes that are each generally parallel with respect to one another, and at least one carbon nanotube that is not parallel with respect to the first plurality of carbon nanotubes;

forming a logic cell from a portion of the layer of carbon nanotubes comprising:
  forming a plurality of cell nodes in or on the layer of carbon nanotubes and comprising a first input contact, a second input contact, an output contact, a first gate region, and a second gate region, by:
    positioning the output contact between the first input contact and the second input contact, and providing a cell region bounded by a width of the output contact and residing between the first input contact and the second input contact;
    positioning the first gate region between the first input contact and the output contact; and
    positioning the second gate region between the second input contact and the output contact, and wherein the first gate region and the second gate region are positioned to provide a logic function; and
  forming at least one nonconductive region in the layer of carbon nanotubes, positioned within the cell region and between any two or more of the plurality of cell nodes that, if shorted, would inhibit the logic function.

24. The method of claim 23 further comprising forming a plurality of nonconductive regions in the layer of carbon nanotubes, each of the plurality of nonconductive regions positioned between two of the plurality of cell nodes that, if shorted, would inhibit the logic function.

* * * * *

UNITED STATES PATENT AND TRADEMARK OFFICE
CERTIFICATE OF CORRECTION

| | | |
|---|---|---|
| PATENT NO. | : 7,911,234 B1 | Page 1 of 1 |
| APPLICATION NO. | : 12/240365 | |
| DATED | : March 22, 2011 | |
| INVENTOR(S) | : Patil et al. | |

It is certified that error appears in the above-identified patent and that said Letters Patent is hereby corrected as shown below:

In the Specification Under Column 1:

• Please replace Column 1, line no. 7-9 with:

-- FEDERALLY-SPONSORED RESEARCH OR DEVELOPMENT
This invention was made with Government support under contract HR0011-07-3-0002 awarded by the Defense Advanced Research Projects Agency. The Government has certain rights in this invention. --

Signed and Sealed this
Twenty-eighth Day of May, 2013

Teresa Stanek Rea
*Acting Director of the United States Patent and Trademark Office*